(12) United States Patent
Ariki

(10) Patent No.: US 9,831,146 B1
(45) Date of Patent: Nov. 28, 2017

(54) MOLDED PACKAGE

(71) Applicant: DENSO CORPORATION, Kariya, Aichi-pref. (JP)

(72) Inventor: Tomohide Ariki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/319,475

(22) PCT Filed: Jun. 26, 2015

(86) PCT No.: PCT/JP2015/003235
§ 371 (c)(1),
(2) Date: Dec. 16, 2016

(87) PCT Pub. No.: WO2016/006193
PCT Pub. Date: Jan. 14, 2016

(30) Foreign Application Priority Data

Jul. 11, 2014 (JP) ................................. 2014-143257

(51) Int. Cl.
*H01L 23/495* (2006.01)
*H01L 23/29* (2006.01)
(Continued)

(52) U.S. Cl.
CPC .............. *H01L 23/29* (2013.01); *H01L 23/31* (2013.01); *H01L 23/48* (2013.01); *H01L 23/50* (2013.01);
(Continued)

(58) Field of Classification Search
CPC ......... H01L 23/29; H01L 23/31; H01L 23/48; H01L 23/50; H01L 23/49541; H01L 23/495; H01L 23/49565; H01L 23/49544; H01L 23/49582; H01L 23/49586; H01L 2924/1815; H01L 2224/83385;
(Continued)

(56) References Cited

U.S. PATENT DOCUMENTS 5,233,222 A * 8/1993 Djennas ................ H01L 21/565
                                                257/666
8,368,192 B1 * 2/2013 Chen ..................... H01L 23/49531
                                                257/676
(Continued)

FOREIGN PATENT DOCUMENTS

JP      S63-213362 A    9/1988
JP      H02-133951 A    5/1990
(Continued)

*Primary Examiner* — Thanh T Nguyen
(74) *Attorney, Agent, or Firm* — Posz Law Group, PLC

(57) ABSTRACT

A molded package includes an IC chip mounted on a first surface of a lead frame, and a molded resin encapsulating the lead frame together with the IC chip. The molded resin has a second surface-side opening portion that is formed to expose a chip correspondence portion of a second surface of the lead frame corresponding to the IC chip. A filler material is filled in the second surface-side opening portion. The filler material has a thermal conductivity equal to or greater than that of the molded resin and is softer than the molded resin. The chip correspondence portion has a rough surface with fine splits so as to increase a contact area with the filler material, and the filler material is in contact with the external member.

7 Claims, 5 Drawing Sheets

(51) Int. Cl.
*H01L 23/31* (2006.01)
*H01L 23/48* (2006.01)
*H01L 23/50* (2006.01)

(52) U.S. Cl.
CPC .. *H01L 23/49582* (2013.01); *H01L 23/49586* (2013.01); *H01L 2224/32245* (2013.01); *H01L 2224/48091* (2013.01); *H01L 2224/48247* (2013.01); *H01L 2224/73265* (2013.01); *H01L 2224/83385* (2013.01); *H01L 2924/1815* (2013.01)

(58) Field of Classification Search
CPC . H01L 2224/73265; H01L 2224/48247; H01L 2224/48091; H01L 2224/32245
See application file for complete search history.

(56) References Cited

U.S. PATENT DOCUMENTS

| | | | |
|---|---|---|---|
| 2002/0020907 A1* | 2/2002 | Seo | H01L 23/4951 257/687 |
| 2012/0043628 A1* | 2/2012 | Martin | B81B 7/0048 257/416 |
| 2013/0062745 A1 | 3/2013 | Kimura | |
| 2015/0008568 A1* | 1/2015 | Tsukagoshi | H01L 23/24 257/676 |
| 2015/0102474 A1 | 4/2015 | Kimura | |

FOREIGN PATENT DOCUMENTS

| | | |
|---|---|---|
| JP | 2010-245468 A | 10/2010 |
| JP | 2011-151225 A | 8/2011 |
| JP | 2014-022444 A | 2/2014 |

\* cited by examiner

MOLDED PACKAGE

CROSS REFERENCE TO RELATED APPLICATIONS

This application is the U.S. national stage of International Patent Application No. PCT/JP2015/003235 filed on Jun. 26, 2015 and is based on Japanese Patent Application No. 2014-143257 filed on Jul. 11, 2014, the disclosures of which are incorporated herein by reference.

TECHNICAL FIELD

The present disclosure relates to a molded package in which a lead frame having an IC chip thereon is encapsulated with a molded resin, and particularly relates to improvement of thermal conduction of the molded package to an external member outside of the molded package.

BACKGROUND ART

As such a type of molded package, it has been conventionally proposed a molded package that includes a metal lead frame, an IC chip mounted on a first surface of the lead frame, and a molded resin encapsulating the lead frame together with the IC chip while exposing a second surface of the lead frame from the molded resin (for example, see patent literature 1).

This type of the molded package generally realizes a thermal conduction with an external member, such as a printed board, by connecting the second surface of the lead frame exposing from the molded resin to the external member through an insulating heat dissipation sheet. This conventional configuration enables the molded package to detect the temperature of the external member and to dissipate heat generated from the IC chip to the external member.

PRIOR ART LITERATURE

Patent Literature

Patent Literature 1: JP 2014-022444 A

SUMMARY OF INVENTION

For example, in a case where the molded package is provided as a humidity sensor or the like, the external member to which the heat is conducted is likely to be glass, which is weaker than the printed board. In the conventional thermal conduction structure, therefore, a cushion member is additionally needed between the second surface of the lead frame and the external member as the metal lead frame is pressed against the external member. As a result, the thermal conduction structure is likely to be complicated, and increased in size.

Further, it is desirable to increase a thermal conductivity between the molded package and the external member in order to sense the temperature of the external member and to dissipate the heat of the IC chip.

It is an object of the present disclosure to improve, of a molded package in which a lead frame having an IC chip thereon is encapsulated with a molded resin and which realizes thermal conduction to an external member by being in contact with the external member, a thermal conductivity with a simplified thermal conduction structure while alleviating an impact to the eternal member.

According to an aspect of the present disclosure, a molded package includes a metal lead frame having a first surface and a second surface opposite the first surface, an IC chip mounted on the first surface of the lead frame, and a molded resin encapsulating the first surface and the second surface of the lead frame together with the IC chip.

In the above molded package, the second surface of the lead frame includes a chip correspondence portion at a position corresponding to the IC mounted on the first surface. The molded resin is formed with a second surface-side opening portion on the second surface to expose the chip correspondence portion. The second surface-side opening portion is filled with a filler material so that the filler material is directly in contact with the chip correspondence portion and seals the second surface-side opening portion. The filler material has a thermal conductivity equal to or greater than that of the molded resin, and is softer than the molded resin. The chip correspondence portion has a surface shape that ensures a larger contact area with the filler material relative to a portion of the second surface of the lead frame other than the chip correspondence portion. The molded package is to be in contact with an external member located outside of the molded package at the filler material.

In this structure, heat can be dissipated to the external member through the filler material that is in contact with the external member. Further, the filler material, which is soft and in contact with the external member, serves as a cushion, thereby to alleviate an impact to the external member. Since the filler material is integrated into the molded package, it is not necessary to add a separate cushion member.

The chip correspondence portion of the second surface of the lead frame, which is in contact with the filler material, is processed by a contact area increasing treatment so as to have a surface shape that enables an increase in contact area with the filler material. Therefore, the thermal conductivity between the IC chip and the external member through the filler material improves.

Accordingly, in the present disclosure, the thermal conductivity can be improved with a simplified thermal conduction structure as well as alleviation of the impact to the external member.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
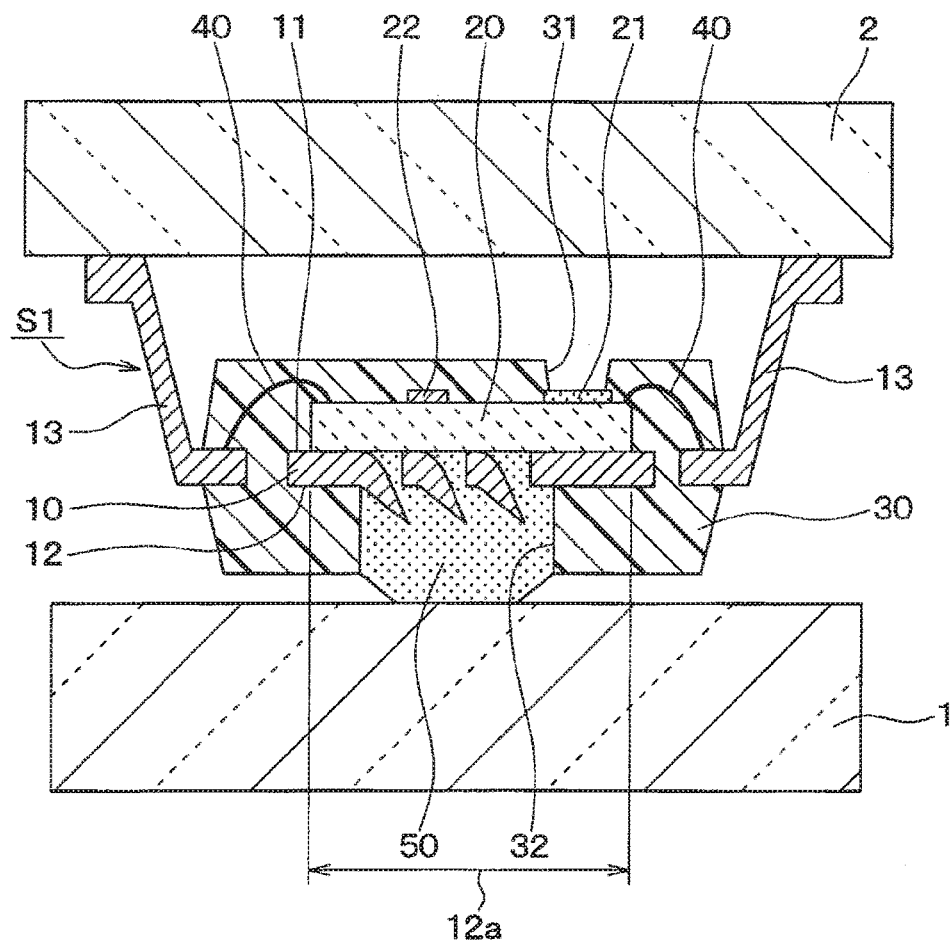
FIG. 1 is a schematic cross-sectional view of a molded package according to a first embodiment of the present disclosure.

Hereinafter, embodiments of the present disclosure will be described with reference to the drawings. In the embodiments described hereinafter, the same or equivalent parts will be designated with the same reference numbers for the sake of simplification of the description.

First Embodiment

A molded package S1 according to the first embodiment of the present disclosure will be described with reference to FIGS. 1 and 2. The molded package S1 of the present embodiment is, for example, used as a humidity sensor of a vehicle air conditioning apparatus.

Specifically, an external member 1 located outside of the molded package S1 is glass, such as a windshield of a vehicle. The molded package S1 is attached to the external member 1 and detects the humidity inside of the passenger compartment and the temperature of the external member 1.

The molded package S1 of the present embodiment includes, as main components, a metal lead frame 10, an IC chip 20, and a molded resin 30. The lead frame 10 has a first surface 11 and a second surface 12 opposite to the first surface 11. The IC chip 20 is mounted on the first surface 11 of the lead frame 10. The molded resin 30 encapsulates the first surface 11 and the second surface 12 of the lead frame 10 with the IC chip 20.

The molded package S1 of the present embodiment includes the above-described lead frame 10 and lead terminals 13. The lead frame 10 and the lead terminals 13 are integrally made of a metallic plate-shaped lead frame material. After being encapsulated with the molded resin 30, the lead frame 10 and the lead terminals 13 are separated from each other by cutting off a lead.

In this way, the lead frame 10 is provided as a plate-shaped member in which the first surface 11 and the second surface 12 are opposite to each other as a front surface and a rear surface. The lead frame 10 serves as a chip-mounting portion (that is, an island) onto which the IC chip 20 is mounted. The lead terminals 13 are provided at plural positions on a periphery of the lead frame 10, and each has a narrow plate-like shape.

The portions of the lead terminals 13 adjacent to the lead frame 10 are encapsulated in the molded resin 30, and are referred to as inner leads. Also, the portions of the lead terminals 13 opposite to the inner leads project outside of the molded resin 30, and are referred to as outer leads. The metal forming the lead frame 10 and the lead terminals 13 is a conductive metal, such as copper (Cu) and 42 Alloy.

The IC chip 20 is a semiconductor chip made of a silicon semiconductor or the like. The IC chip 20 is made by a general semiconductor processing. The IC chip 20 is fixed to the lead frame 10 through a die mounting material, such as solder or adhesive, which is not illustrated.

The IC chip 20 outputs a signal based on the humidity inside of the passenger compartment and the temperature of the external member 1, as described above. Specifically, the IC chip 20 includes a sensing unit that generates a signal based on the humidity and the temperature, and a circuit unit that controls the sensing portion.

Figure 2:
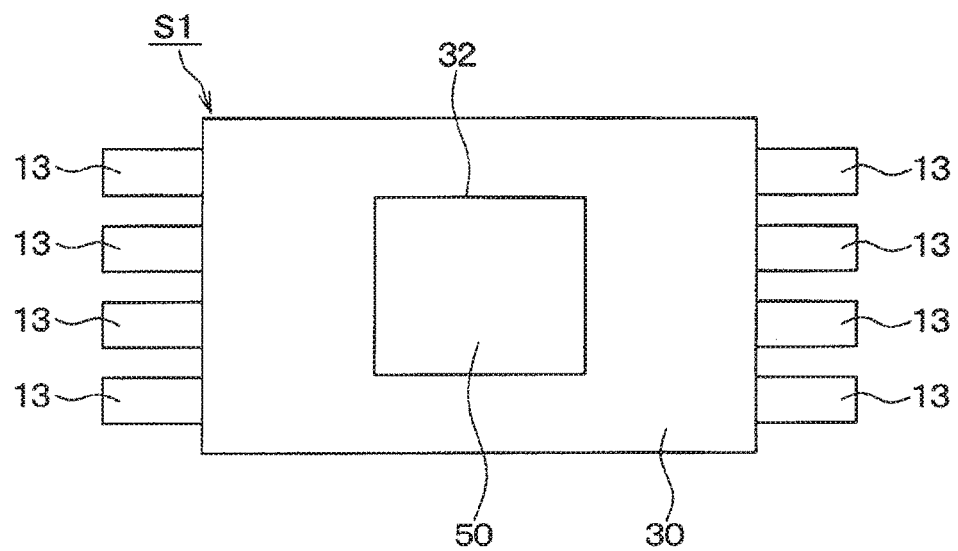
FIG. 2 is a schematic plan view of the molded package of FIG. 1 when viewed from a bottom.

In FIG. 1, as a part of the sensing unit, a moisture sensitive film 21 and a temperature sensing portion 22 are illustrated. The moisture sensitive film 21 is, for example, made of a hygroscopic organic polymer material. The moisture sensitive film 21 has a function of changing its dielectric constant depending on the humidity. The sensing portion has a sensing electrode, which is not illustrated. The sensing electrode is in contact with the moisture sensitive film 21.

The sensing electrode generates a signal according to a change in dielectric constant of the moisture sensitive film 21.

The temperature sensing portion 22 is, for example, made of a general thermistor. Although not illustrated, the circuit unit is made of components, such as a transistor and wirings, disposed inside of the IC chip 20. The signals from the sensing electrode and the temperature sensing portion 22 are processed by the circuit unit and then output from the circuit unit. As such, the IC chip 20 of the present embodiment is configured as a humidity detection element that detects the humidity and the temperature.

The molded resin 30 is formed with a first surface-side opening portion 31 adjacent to the first surface 11 of the lead frame 10. The moisture sensitive film 21, which is a part of the IC chip 20, is an exposing portion exposing from the molded resin 30 through the first surface-side opening portion 31. Thus, the moisture sensitive film 21 is exposed to an environment outside of the package. In this example, the moisture sensitive film 21 is exposed to the humidity inside of the passenger compartment, as the environment outside of the package.

As shown in FIG. 1, the IC chip 20 and the inner leads of the lead terminals 13 are connected to each other, inside of the molded resin 30, through wires 40 made of aluminum (Al), gold (Au), or the like. The wires 40 are made of general bonding wires. The IC chip 20 and the lead terminals 13 are electrically connected to each other through the wires 40.

The outer leads of the lead terminals 13 are electrically and physically connected to a housing 2 supporting the molded package S1 by soldering, welding or the like. The housing 2 is a wiring board such as a ceramic board or a printed circuit board. Thus, the IC chip 20 is electrically connected to the housing 2 through the wires 40 and the lead terminals 13.

The molded resin 30 is made of a general molding material, such as an epoxy resin. The molded resin 30 is molded by a transfer molding technique or a compression molding technique. The molded resin 30 may be a resin containing a filler having an excellent thermal conductivity such as alumina or silica for the purpose of adjusting a coefficient of linear expansion.

In this type of molded package S1, the second surface 12 of the lead frame 10 includes a chip correspondence portion 12a at a position corresponding to the IC chip 20 on the first surface 11 of the lead frame 10.

More specifically, the chip correspondence portion 12a is the portion of the second surface 12 of the lead frame 10 defined when the IC chip 20 is projected onto the second surface 12 of the lead frame 10. The chip correspondence portion 12a has the same shape as a planar shape of the IC chip 20, and has the same surface area as the IC chip 20. In FIG. 1, a range indicated by arrows is the portion of the second surface 12 of the lead frame 10 corresponding to the chip correspondence portion 12a.

The molded resin 30 has the second surface-side opening portion 32 adjacent to the second surface 12 of the lead frame 10 so as to expose the chip correspondence portion 12a. In this example, the second surface-side opening portion 32 is not formed to correspond to the entirety of the chip correspondence portion 12a, but is formed to correspond to a part of the chip correspondence portion 12a. Alternatively, the second surface-side opening portion 32 may be formed to correspond to the entirety of the chip correspondence portion 12a.

In the present embodiment, the second surface-side opening portion 32 of the molded resin 30 is sealed with a filler material 50 so that the chip correspondence portion 12a is not exposed to the outside of the molded package S1. That is, the filler material 50 is filled in the second surface-side opening portion 32 to be in direct contact with the chip correspondence portion 12a and to seal the second surface-side opening portion 32.

The filler material 50 has a thermal conductivity equal to or greater than that of the molded resin 30. The filler material 50 is softer than the molded resin 30. That is, the filler material 50 has a lower modulus than the molded resin 30. Examples of the filler material 50 are a resin, such as a silicone resin, silver paste, a gel, and a rubber.

As further examples of the filler material 50, the resin, gel and rubber descried above may contain a filler having an excellent thermal conductivity. Examples of the filler may be a metal such as Ag, alumina, ceramic such as silica. In such cases, improvement of the thermal conductivity of the filler material 50 is expected.

The filler material 50 is formed by being filled in the second surface-side opening portion 32 by potting and then cured, after the lead frame 10 on which the IC chip 20 has been mounted and connected by the wire bonding is encapsulated by the molded resin 30. The filler material 50 may be formed by any methods other than the potting. For example, the filler material 50 may be formed by implanting a filler material 50 having a sheet shape into the second surface-side opening portion 32.

The chip correspondence portion 12a, which contacts with the filler material 50 at the bottom of the second surface-side opening portion 32, has a surface shape that realizes an increase in contact area with the filler material 50 relative to a portion other than the chip correspondence portion 12a, of the second surface 12 of the lead frame 10. That is, on the second surface 12 of the lead frame 10, an effective surface area of the chip correspondence portion 12a including projections and recesses is greater than an effective surface area of the portion other than the chip correspondence portion 12a, per the same unit area.

In the present embodiment, specifically, the chip correspondence portion 12a is configured to have a surface with fine splits, as shown in FIG. 1. This surface with the fine splits is, for example, similar to a surface shape of a vegetable grater, and is formed by pressing or the like. In the chip correspondence portion 12a, the increase in the contact area described above can be realized by projections of the fine splits.

More specifically, the chip correspondence portion 12a having the surface with the fine splits is configured as a rough surface that is formed so that the portion of the lead frame 10 corresponding to the chip correspondence portion 12a has a plate shape with projections and recesses in cross-section.

The projections of the rough surface provide the fine splits, and each tapers off toward its tip end. Since the projections have such a tapering off shape, an efficiency of heat exchange between the filler material 50 and the chip correspondence portion 12a improves.

In the present embodiment, as shown in FIG. 1, the molded package S1 is in contact with the external member 1 that is located outside of the molded package S1 through the filler material 50.

The filler material 50 protrudes outside of the molded package S1 from an outer surface of the molded resin 30, the outer surface defining a perimeter of the second surface-side opening portion 32. That is, the filler material 50 protrudes toward the external member 1. Thus, the molded package S1 is in contact with the external member 1 only at the filler material 50, and the outer surface of the molded resin 30 opposing to the external member 1 is in a state of being separated from the external member 1.

As shown in FIG. 1, the molded package S1 is in the state of being interposed between the external member 1 and the housing 2. Although not illustrated, the housing 2 may be connected to the external member 1 with screws or engaged with the external member 1. Thus, the housing 2, the molded package S1 and the external member 1 are stably integrated with each other without vibrations.

The condition shown in FIG. 1 can be realized, after the molded package S1 is assembled to the housing 2, by connecting the housing 2 to the external member 1 in a state where the filler material 50 is opposed to the external member 1 and pushed against the external member 1.

The molded package S1 of the present embodiment, which is used as the humidity sensor of the vehicle air conditioning apparatus, operates in a following manner. Heat of the external member 1, such as a windshield, is thermally conducted to the IC chip 20 through the filler material 50 and the chip correspondence portion 12a, so the IC chip 20 detects the temperature of the external member 1. Further, the IC chip 20 detects an ambient humidity outside of the molded package S1, such as the humidity inside of the passenger compartment, through the moisture sensitive film 21 exposed from the molded resin 30.

The IC chip 20 calculates the dew point temperature based on signals indicative of the temperature and humidity detected. For example, the dew point temperature is fed back to a control unit of the vehicle air conditioning apparatus, to be used for various air conditioning controls, such as a control of the temperature of the passenger compartment.

In the present embodiment, the molded package S1 is in contact with the external member 1 at the filler material 50 and can dissipate heat through the external member 50. Further, since the soft filler material 50 in contact with the external member 1 serves as a cushion to alleviate an impact to the external member 1.

In the present embodiment, particularly, the molded package S1 is in contact with the external member 1 only at the filler material 50, and the outer surface of the molded resin 30, which is harder than the filler material 50, is separated from the external member 1. Therefore, the impact can be effectively alleviated.

The filler material 50 is integrated into the molded package S1 as a part of the molded package S1. Therefore, it is not necessary to add a separate cushion member having a cushioning property between the molded package S1 and the external member 1.

Of the second surface 12 of the lead frame 10, the chip correspondence portion 12a, which is in contact with the filler material 50, is processed with a contact area increasing treatment to have the surface shape that increases the contact area with the filler material 50. Therefore, the thermal conductivity between the IC chip 20 and the external member 1 through the filler material 50 improves. In the present embodiment, therefore, the thermal conductivity can be improved while simplifying the structure for the thermal conduction and alleviating the impact to the external member 1.

In the present embodiment, as described above, the filler material 50 protrudes from the second surface-side opening portion 32 more to the outside of the molded package S1 than the outer surface of the molded resin 30. Therefore, the molded package S1 can be easily brought into contact with the external member 1 only at the filler material 50, without contacting the molded resin 30 with the external member 1.

Second Embodiment

Figure 3:
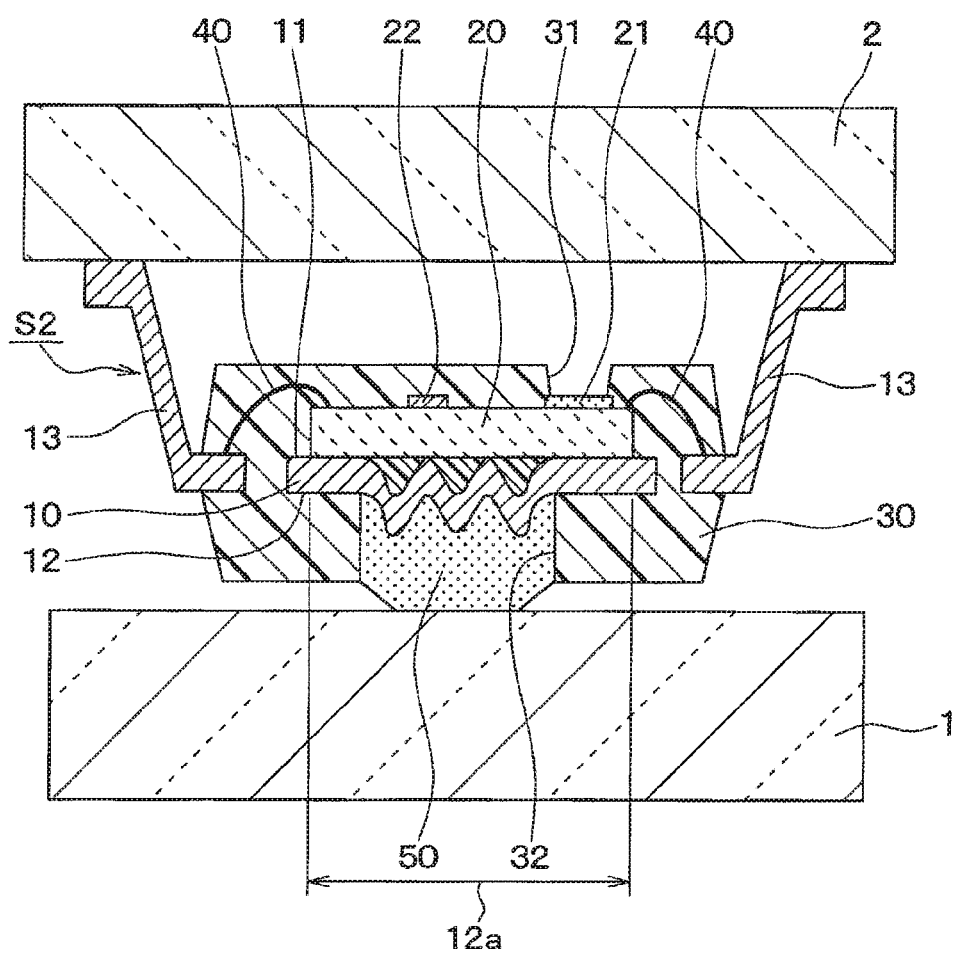
FIG. 3 is a schematic cross-sectional view of a molded package according to a second embodiment of the present disclosure.

A molded package S2 according to a second embodiment of the present disclosure will be described with reference to FIG. 3. In the present embodiment, the molded package S2 is different from the molded package S1 of the first embodiment as the surface shape of the chip correspondence portion 12a is modified, and thus the difference will be mainly described hereinafter.

Also in the present embodiment, the chip correspondence portion 12a has a rough surface that is provided by forming the portion of the lead frame 10 corresponding to the chip correspondence portion 12a into a plate shape having projections and recesses in cross section, as the surface shape that can increase the contact area with the filler material 50.

In the first embodiment, the rough surface is formed as the surface with the fine splits. In the present embodiment, on the other hand, the rough surface is provided by a waved plate shape having substantially a uniform plate thickness.

In the present embodiment, the rough surface is, for example, formed by pressing the chip corresponding portion 12a of the lead frame 10 with upper and lower dies having the projections and recesses. Also in the present embodiment, the thermal conductivity can be improved by processing the chip correspondence portion 12a with the contact area increasing treatment as described above, similar to the first embodiment described above.

Third Embodiment

Figure 4:
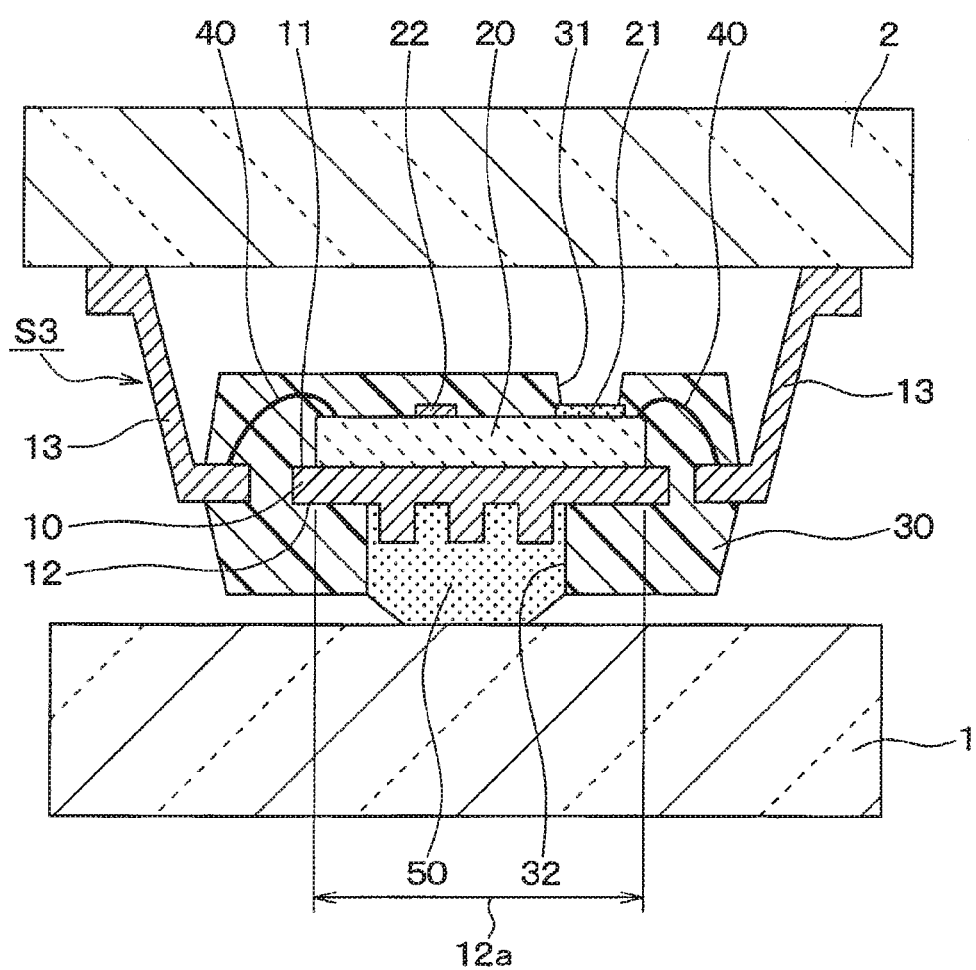
FIG. 4 is a schematic cross-sectional view of a molded package according to a third embodiment of the present disclosure.

A molded package S3 according to a third embodiment of the present disclosure will be described with reference to FIG. 4. In the present embodiment, the molded package S3 is different from the molded package S2 of the second embodiment as the surface shape of the chip correspondence portion 12a is modified, and thus the difference will be mainly described hereinafter.

The chip correspondence portion 12a of the second embodiment described above has the rough surface having substantially the uniform thickness, which is made by the pressing. In the present embodiment, on the other hand, the rough surface of the chip correspondence portion 12a is formed by partially differentiating the thickness of the chip correspondence portion 12a by a mold processing. Also in the present embodiment, the similar effects to the second embodiment can be expected.

Also in the second embodiment and the third embodiment described above, the projections of the rough surface of the chip correspondence portion 12a may have a tapering off shape by adjusting the shape of the pressing die and the molding die.

Fourth Embodiment

Figure 5:
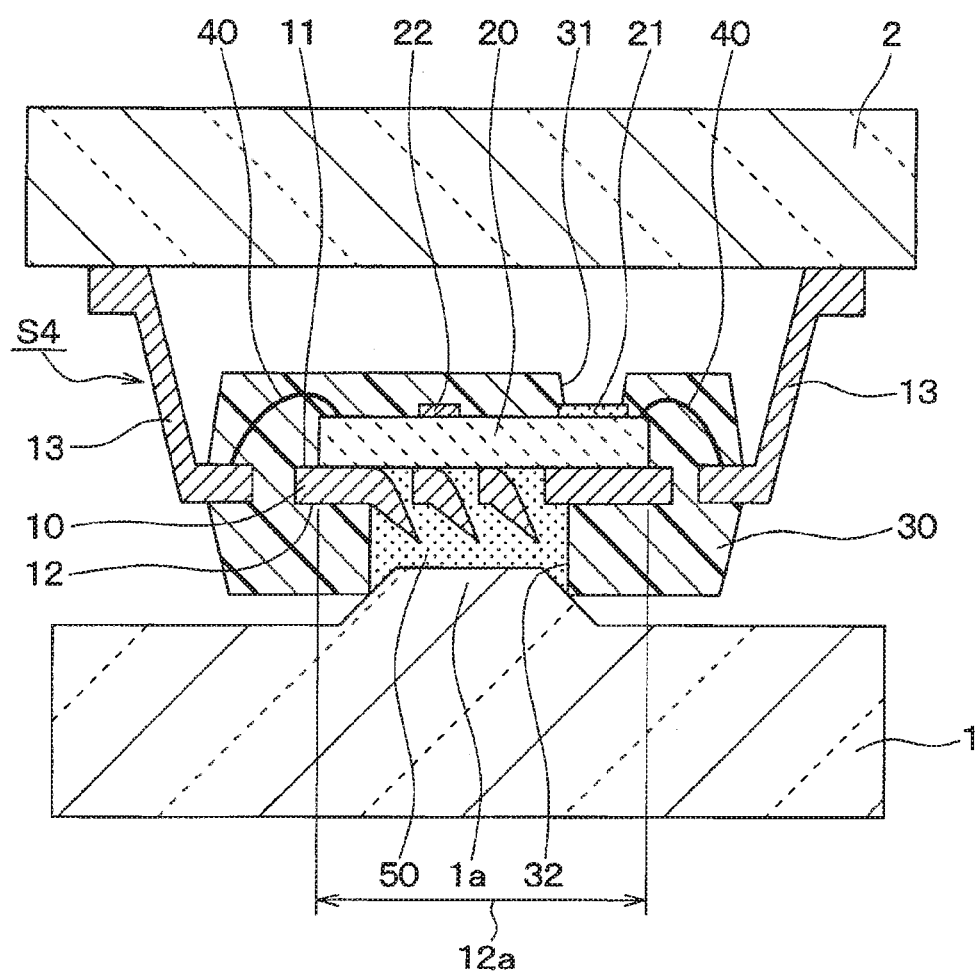
FIG. 5 is a schematic cross-sectional view of a molded package according to a fourth embodiment of the present disclosure.

A molded package S4 according to a fourth embodiment of the present disclosure will be described with reference to FIG. 5. In the present embodiment, the molded package S4 is different from the molded package S1 of the first embodiment as the shape of the filler material 50 filled in the second surface-side opening portion 32 is modified, and thus the difference will be mainly described hereinafter.

In the first embodiment described above, the filler material 50 is filled so as to have the shape that protrudes outside of the molded package S1 from the second surface-side opening portion 32 of the molded resin 30, as shown in FIG. 1. In the present embodiment, as shown in FIG. 5, the filler material 50 is filled in the second surface-side opening portion 32 so that the filler material 50 is located inside of the second surface-side opening portion 32 than the outer surface of the molded resin 30, the outer surface defining the perimeter of the second surface-side opening portion 32.

In the present embodiment, the external member 1 has a projection 1a at the position to be in contact with the filler material 50. Also in the present embodiment, therefore, the molded package S4 is in contact with the external member 1 only at the filler material 50, and the outer surface of the molded resin 30 is in the state of being separated from the external member 1.

Also in the present embodiment, the similar effects to the first embodiment can be expected, as described above. In the present embodiment, only the filled shape of the filler material 50 is modified from the first embodiment described above. Therefore, the present embodiment can be combined with the second embodiment or the third embodiment described above.

Other Embodiments

In the embodiments described hereinabove, the chip correspondence portions 12a each have the surface shape that can increase the contact area with the filler material 50, such as the rough surface with the fine splits, and the rough surface provided by the plate shape with projections and recesses in cross section, which is formed by pressing, die processing, or the like. In these examples illustrated as above, such rough surfaces are each formed, of the chip correspondence portion 12a, in a region corresponding to the second surface-side opening portion 32. Alternatively, the rough surfaces may be each formed in the entire region of the chip correspondence portion 12a.

Figure 6:
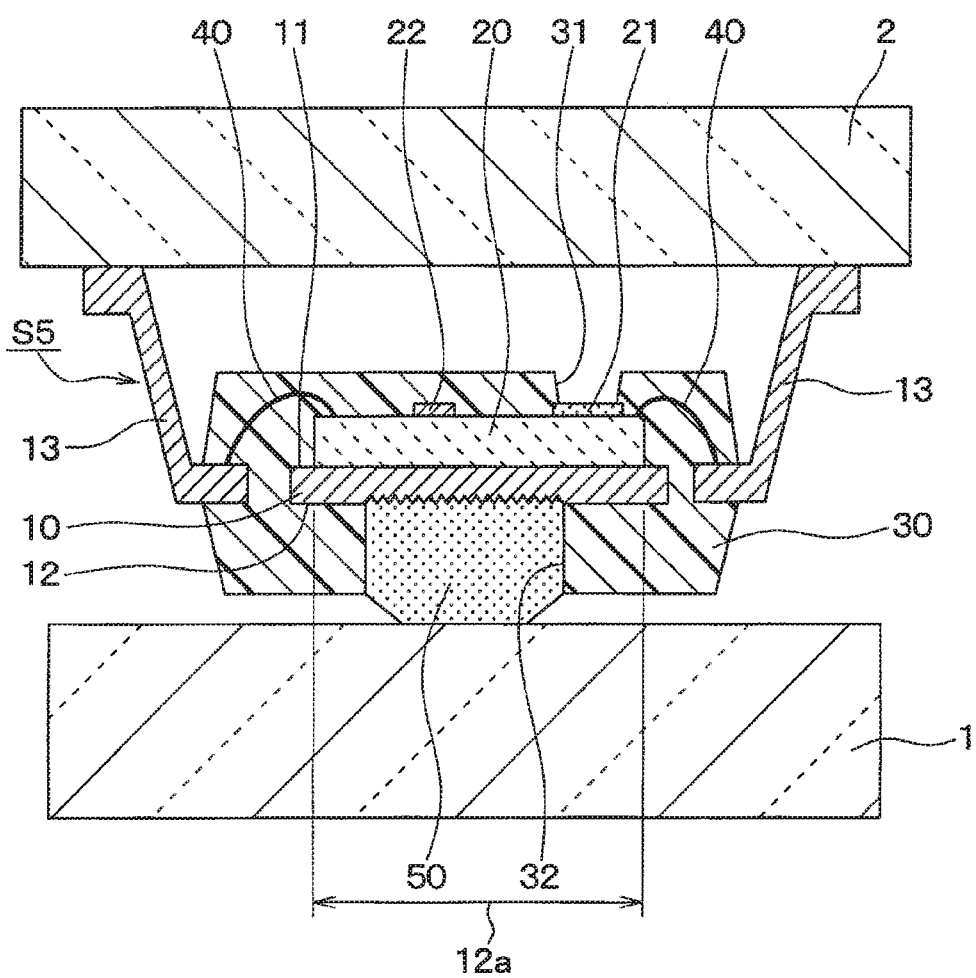
FIG. 6 is a schematic cross-sectional view of a molded package according to another embodiment of the present disclosure.

The shapes of the chip correspondence portion 12a are not limited to the rough surfaces described above. As shown in FIG. 6, for example, the chip correspondence portion 12a may have a surface shape that is formed by roughening the surface of the chip correspondence portion 12a. In such a case, the chip correspondence portion 12a can be roughened by a roughening processing such as a sand blasting. In this case, microscopic asperities are formed on the chip correspondence portion 12a, thereby realizing the increase in the contact area as described above.

In the embodiments described hereinabove, the molded packages are exemplarily used as the humidity sensor. However, use of the molded packages is not limited to the humidity sensor.

For example, the IC chip 20 may be a heat generating element such as a power element and a microcomputer. In such a case, the molded resin 30 may not have the first surface-side opening portion 31, and the IC chip 20 is entirely encapsulated by the molded resin 30 without having an exposed portion exposing from the molded resin 30.

In the embodiments described above, the lead frame 10 and the lead terminals 13 are made from an integral metallic plate-shaped lead frame material. Alternatively, the lead frame 10 and the lead terminals 13 may be individually formed from separate materials.

The IC chip 20 and the lead terminals 13 may be connected to each other by various connecting methods, which are generally used, other than the connecting method using the wires 40 as described above. The shape of the outer leads connected to the housing 2 is not limited to the example described above.

In the embodiments described above, the molded packages each have the outer leads projecting from the molded resin 30. Alternatively, the molded package may be a package without having outer leads, such as a QFN package (quad flat non-lead package)

The present disclosure has been described based on the embodiments, but it is to be understood that the present disclosure is not limited to the embodiments and configuration described above. The present disclosure embraces various modifications including modifications falling within an equivalent scope. Furthermore, various combinations and aspects, and also other combinations and aspects including only an element or less than an element or more than an element of such various combinations and aspects are also included in the scope and idea of the present disclosure.

The invention claimed is:

1. A molded package comprising:
   a metal lead frame having a first surface and a second surface opposite to the first surface;
   an IC chip mounted on the first surface of the lead frame; and
   a molded resin encapsulating the first surface and the second surface of the lead frame and the IC chip, wherein
   the second surface of the lead frame includes a chip correspondence portion at a position corresponding to the IC chip on the first surface of the lead frame,
   the molded resin has a second surface-side opening portion on the second surface of the lead frame to expose the chip correspondence portion from the molded resin,
   a filler material is filled in the second surface-side opening portion so that the filler material is directly in contact with the chip correspondence portion and seals the second surface-side opening portion, the filler material having a thermal conductivity equal to or greater than that of the molded resin, and being softer than the molded resin,
   the chip correspondence portion has a surface shape that increases a contact area with the filler material relative to a portion of the second surface of the lead frame other than the chip correspondence portion, and
   the filler material is configured to allow the molded package to be in contact with an external member located outside of the molded package at the filler material.

2. The molded package according to claim 1, wherein
   the surface shape of the chip correspondence portion includes a rough surface that is provided by a plate shape with projections and recesses in cross section formed at the position of the lead frame corresponding to the chip correspondence portion.

3. The molded package according to claim 2, wherein
   the rough surface of the chip correspondence portion has projections that taper off toward tip ends so as to increase an efficiency of heat exchange with the filler material.

4. The molded package according to claim 3, wherein
   the rough surface having the projections tapering off toward the tip ends includes a surface with fine splits.

5. The molded package according to claim 1, wherein
   the filler material protrudes outside from an outer surface of the molded resin defining a perimeter of an opening of the second surface-side opening portion.

6. The molded package according to claim 1, wherein
   the filler material contains a filler having a thermal conductivity.

7. The molded package according to claim 1, wherein
   the IC chip is a humidity detection element detecting a humidity,
   the molded resin has a first surface-side opening portion adjacent to the first surface of the lead frame, and a part of the IC chip exposes from the molded resin through the first surface-side opening portion as an exposing portion, and
   the exposing portion includes a moisture sensitive film that is provided in the IC chip and has a function of changing a dielectric constant according to the humidity.

* * * * *